(12) United States Patent
Zhu et al.

(10) Patent No.: US 11,854,939 B2
(45) Date of Patent: Dec. 26, 2023

(54) THREE-DIMENSIONAL INTEGRATED SYSTEM OF DRAM CHIP AND PREPARATION METHOD THEREOF

(71) Applicants: FUDAN UNIVERSITY, Shanghai (CN); SHANGHAI INTEGRATED CIRCUIT MANUFACTURING INNOVATION CENTER CO., LTD, Shanghai (CN)

(72) Inventors: Bao Zhu, Shanghai (CN); Lin Chen, Shanghai (CN); Qingqing Sun, Shanghai (CN); Wei Zhang, Shanghai (CN)

(73) Assignees: Fudan University, Shanghai (CN); Shanghai Integrated Circuit Manufacturing Innovation Center Co., Ltd., Shanghai (CN)

( * ) Notice: Subject to any disclaimer, the term of this patent is extended or adjusted under 35 U.S.C. 154(b) by 373 days.

(21) Appl. No.: 17/052,861

(22) PCT Filed: Jul. 2, 2020

(86) PCT No.: PCT/CN2020/099997
§ 371 (c)(1),
(2) Date: Mar. 23, 2021

(87) PCT Pub. No.: WO2022/000438
PCT Pub. Date: Jan. 6, 2022

(65) Prior Publication Data
US 2023/0098556 A1    Mar. 30, 2023

(30) Foreign Application Priority Data
Jun. 30, 2020 (CN) .......................... 202010620300.5

(51) Int. Cl.
*H01L 23/48* (2006.01)
*H10B 12/00* (2023.01)
(Continued)

(52) U.S. Cl.
CPC ............ *H01L 23/481* (2013.01); *H01L 24/11* (2013.01); *H01L 24/14* (2013.01);
(Continued)

(58) Field of Classification Search
CPC ................................ H10B 12/30; H01L 24/11
See application file for complete search history.

(56) References Cited

U.S. PATENT DOCUMENTS

2010/0065949 A1* 3/2010 Thies ................ H01L 21/76898
438/109
2012/0139115 A1* 6/2012 You ......................... H01L 24/11
257/751
2018/0301376 A1 10/2018 Shih et al.

FOREIGN PATENT DOCUMENTS

CN         103500729 A      1/2014
CN         110783426 A      2/2020
(Continued)

OTHER PUBLICATIONS

International Search Report and Written Opinion for PCT Application No. PCT/CN2020/099997; China National Intellectual Property Administration; Beijing, China; dated Mar. 16, 2021.
(Continued)

*Primary Examiner* — Mohammad M Choudhry
(74) *Attorney, Agent, or Firm* — Thomas E. Lees, LLC

(57) ABSTRACT

Disclosed is a three-dimensional integrated system for DRAM chips and a fabrication method thereof. A plurality of trench structures are etched on the front and back of a silicon wafer; then, a TSV structure is etched between the two upper and lower trenches opposite to each other for
(Continued)

electrical connection; then, DRAM chips are placed in the trenches, and copper-copper bonding is used to make the chips electrically connected to the TSV structure in a vertical direction; finally, redistribution is done to make the chips in a horizontal direction electrically connected. The invention can make full use of silicon materials, and can avoid problems such as warpage and deformation of an interposer. In addition, placing the chips in the trenches will not increase the overall package thickness, while protecting the chips from external impact.

4 Claims, 7 Drawing Sheets

(51) Int. Cl.
*H01L 23/00* (2006.01)
*H01L 25/065* (2023.01)

(52) U.S. Cl.
CPC ......... *H01L 25/0652* (2013.01); *H10B 12/01* (2023.02); *H10B 12/30* (2023.02); *H01L 2224/17104* (2013.01)

(56) References Cited

FOREIGN PATENT DOCUMENTS

| | | |
|---|---|---|
| CN | 111293078 A | 6/2020 |
| WO | 2012119333 A1 | 9/2012 |

OTHER PUBLICATIONS

English Translation of Written Opinion for PCT Application No. PCT/CN2020/099997; China National Intellectual Property Administration; Beijing, China; dated Mar. 16, 2021.
Chinese first Office action and search report of Chinese Patent Application No. 2020106203005, China National Intellectual Property Administration; Beijing, China; dated Jun. 11, 2021.

* cited by examiner

THREE-DIMENSIONAL INTEGRATED SYSTEM OF DRAM CHIP AND PREPARATION METHOD THEREOF

TECHNICAL FIELD

The present invention relates to the field of integrated circuit packaging, and specifically relates to a three-dimensional integrated system for DRAM (Dynamic Random Access Memory) chips and a fabrication method thereof.

BACKGROUND OF THE INVENTION

With the rapid development of integrated circuit technology, microelectronic packaging technology has gradually become a main factor restricting the development of semiconductor technology. In order to achieve high-density electronic packaging, better performance and lower overall cost, researchers have developed a series of advanced packaging technologies. Among them, the three-dimensional system-in-package technology has good electrical performance, high reliability, and can achieve high-density packaging, so it has been applied to dynamic random access memory (DRAM) chip systems.

Through Silicon Via (TSV) interposer technology is a new technology for stacking chips in three-dimensional integrated circuits to achieve interconnection. Many vertical interconnection vias and subsequent redistribution layer (RDL) are made on silicon wafers to achieve electrical interconnection between different chips. TSV interposer technology can maximize stacking density of DRAM chips in three-dimensional directions, obtain the shortest interconnection lines between chips and the smallest external size, and also greatly improve performances of chips in terms of storage density, speed and low power consumption. Thus it is currently the most attractive one in electronic packaging technologies. However, in order to meet the requirements of overall packaging thickness, typically the silicon wafer is firstly thinned, then the TSV structure is fabricated, and finally the chips are stacked in a vertical direction. Thinning the silicon wafer will undoubtedly increase complexity of process, cause waste of silicon material, and it is also prone to warpage and deformation.

SUMMARY OF THE INVENTION

In order to solve the above problems, embodiments of the present invention disclose a three-dimensional integrated system for DRAM chips, comprising: a top trench, a bottom trench, and a through silicon via that penetrate through a silicon substrate, wherein the through silicon via connects the top trench and the bottom trench;

a first insulating medium, a first copper diffusion barrier layer, and a copper seed layer, wherein the first insulating medium covers the bottom trench and is discontinuous at the bottom of the through silicon via; the first copper diffusion barrier layer is formed on the first insulating medium; the copper seed layer covers the first copper diffusion barrier layer and appears a continuous film; the first copper diffusion barrier layer and the copper seed layer are discontinuous at an adjacent area between the bottom trenches to achieve insulation;

a second insulating medium, a second copper diffusion barrier layer, a copper film, and a conductive copper pillar, wherein the second insulating medium covers the top trench and the sidewall of the through silicon via, and is discontinuous at the top and bottom of the through silicon via; the second copper diffusion barrier layer is formed on the second insulating medium; the copper film covers the second copper diffusion barrier layer within the top trench and appears a continuous film; the conductive copper pillar covers the second copper diffusion barrier layer on the sidewall of the through silicon via, and completely fills the through silicon via, the top of the conductive copper pillar is in contact with the copper film, and the bottom of the conductive copper pillar is in contact with the copper seed layer; the second copper diffusion barrier layer and the copper film are discontinuous at an adjacent area between the top trenches to achieve insulation;

a DRAM chip, contact bumps, a filler, and a redistribution layer, wherein the DRAM chip is bonded to the copper seed layer and the copper film through the contact bumps; the filler fills gaps between the DRAM chip and the copper seed layer and between the DRAM chip and the copper film; the redistribution layer covers the top and bottom of the three-dimensional integrated system.

In the three-dimensional integrated system for DRAM chips of the present invention, preferably, the first insulating medium and the second insulating medium are respectively at least one of $SiO_2$, $Si_3N_4$, SiOCH, and SiOCFH.

In the three-dimensional integrated system for DRAM chips of the present invention, it is preferable that the first copper diffusion barrier layer and the second copper diffusion barrier layer are respectively at least one of TaN, TiN, ZrN, and $MnSiO_3$.

In the three-dimensional integrated system for DRAM chips of the present invention, preferably, the filler is epoxy resin.

Embodiments of the invention also disclose a method for fabricating a three-dimensional integrated system for DRAM chips, which comprises the following steps: forming a top trench and a bottom trench by photolithography and etching on the front and back of a single crystal silicon substrate; depositing sequentially in the bottom trench a first insulating medium, a first copper diffusion barrier layer, and a copper seed layer; etching the silicon substrate between the top trench and the bottom trench to penetrate it to form a through silicon via;

removing the first insulating medium and the first copper diffusion barrier layer at the bottom of the through silicon via to expose the copper seed layer; depositing a second insulating medium and a second copper diffusion barrier layer sequentially on the surfaces of the top trench and the through silicon via; removing the second insulating medium and the second copper diffusion barrier layer at the bottom of the through silicon via to expose the copper seed layer; electroplating copper material on the surface of the copper seed layer to completely fill the through silicon via and be flush with the upper surface of the second copper diffusion barrier layer at the bottom of the top trench, thereby forming a conductive copper pillar; depositing a copper film on the surface of the top trench;

removing the first copper diffusion barrier layer and the copper seed layer in a connection area between adjacent bottom trenches and removing the second copper diffusion barrier layer and the copper film in a connection area between adjacent top trenches; bonding the contact bumps of the DRAM chip with the copper seed layer and the copper film respectively; filling a filler in gaps between the DRAM chip and the top trench and between the DRAM chip and the bottom trench as a buffer layer and isolation layer; forming a redistribution layer on the top and bottom of the resulting structure, so that the DRAM chips in a horizontal direction are electrically connected.

In the method for fabricating a three-dimensional integrated system for DRAM chips of the present invention, preferably, the first insulating medium and the second insulating medium are respectively at least one of $SiO_2$, $Si_3N_4$, and SiOCFH.

In the method for fabricating a three-dimensional integrated system for DRAM chips of the present invention, it is preferable that the first copper diffusion barrier layer and the second copper diffusion barrier layer are respectively at least one of TaN, TiN, ZrN, and $MnSiO_3$.

In the method for fabricating a three-dimensional integrated system for DRAM chips of the present invention, preferably, the filler is epoxy resin.

The invention can make full use of silicon materials, and can avoid problems such as warpage and deformation of the interposer. In addition, placing the chip in the trench does not increase the overall package thickness, but also prevents the chip from being impacted by external forces.

DETAILED DESCRIPTION OF THE INVENTION

Figure 1:
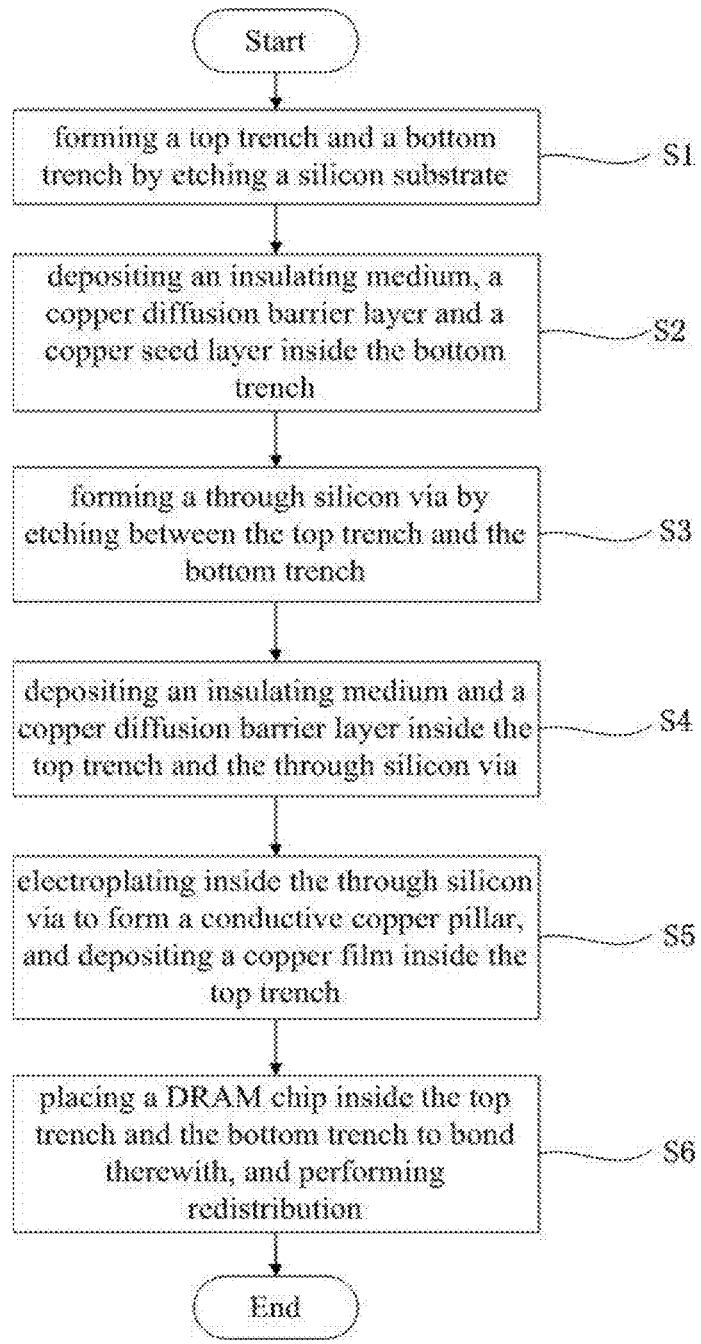
FIG. 1 is a flow chart of a method for fabricating a three-dimensional integrated system for DRAM chips.

In order to make the objectives, technical solutions and advantages of the present invention clearer, the following will clearly and completely describe the technical solutions in the embodiments of the present invention with reference to the accompanying drawings in the embodiments of the present invention. It should be understood that the specific embodiments are only used to explain the present invention, but not to limit the present invention. The described embodiments are only a part of embodiments of the present invention, rather than all the embodiments. Based on the embodiments of the present invention, other embodiments obtained by those of ordinary skill in the art without creative work shall all fall within the protection scope of the present invention.

In the description of the present invention, it should be noted that the orientation or positional relationship indicated by the terms "upper", "lower", "vertical", "horizontal", etc. are based on the orientation or positional relationship shown in the drawings, and are only for the convenience of describing the present invention and simplifying the description, rather than indicating or implying that the device or element referred to must have a specific orientation, be constructed and operated in a specific orientation, and therefore cannot be understood as a limitation of the present invention. in addition, the terms "first" and "second" are only used for descriptive purposes, and cannot be understood as indicating or implying relative importance.

In addition, many specific details of the present invention are described below, such as the structure, materials, dimension, processing procedures and technology of the device, in order to understand the present invention more clearly. However, as those skilled in the art can understand, the present invention may not be implemented according to these specific details. Unless specifically indicated in the following, each part of the device may be composed of materials known to those skilled in the art, or materials with similar functions developed in the future may be used.

The technical solutions of the present invention will be further described below in combination with accompanying FIGS. 1-13 and embodiments. FIG. 1 is a flow chart of a method for fabricating a three-dimensional integrated system for DRAM chips, and FIGS. 2-13 show schematic structural diagrams of the steps of the method for fabricating a three-dimensional integrated system for DRAM chips. As shown in FIG. 1, the specific fabrication steps are as follows.

Figure 2:
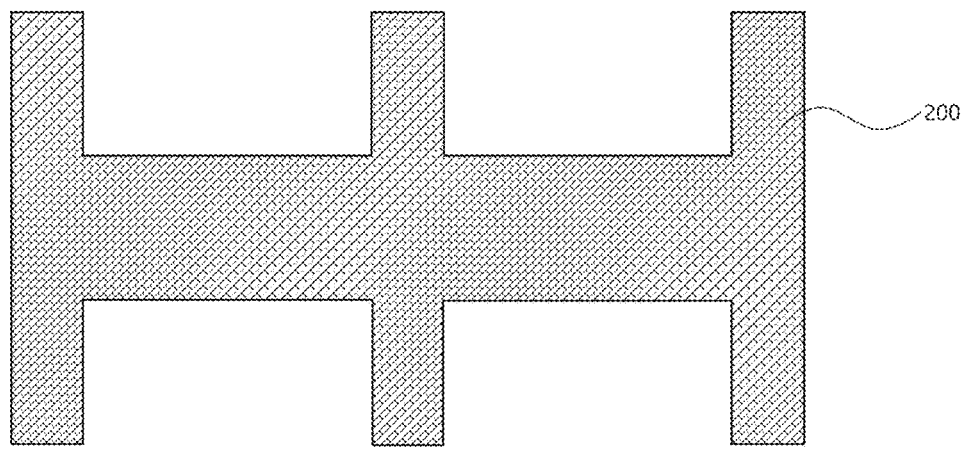
FIGS. 2-13 are schematic structural diagrams of the steps of the method for fabricating a three-dimensional integrated system for DRAM chips.

In step S1, a trench is formed by etching on a silicon substrate. First, photoresist is spin-coated on the front and back of a single crystal silicon substrate 200 and the positions of the top and bottom trenches are defined through exposure and development processes. Then, the trench structures are etched by a reactive ion etching process, and the resulting structure is shown in FIG. 2. The reactive plasma for etching the silicon substrate 200 can be at least one of $CF_4$ and $ST_6$. In this embodiment, a reactive ion etching process is used to obtain the trench structures, but the present invention is not limited to this. At least one process of dry etching such as ion beam etching, plasma etching, reactive ion etching, and laser ablation, or wet etching using an etchant solution, can be selected.

Figure 3:
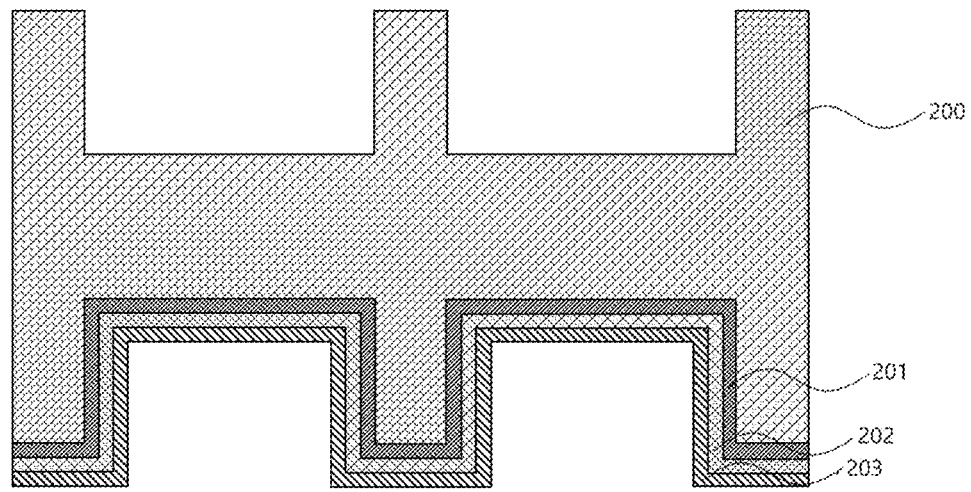

In step S2, a first insulating medium, a first copper diffusion barrier layer and a copper seed layer are deposited on the bottom trench. A physical vapor deposition process is used to sequentially deposit a $SiO_2$ film, a TaN film and a Cu film inside the bottom trench as a first insulating medium 201, a first copper diffusion barrier layer 202 and a copper seed layer 203, respectively. The resulting structure is shown in FIG. 3. In this embodiment, a $SiO_2$ film is used as the first insulating medium, and a TaN film is used as the first copper diffusion harrier layer. However, the present invention is not limited to this. At least one of $SiO_2$, $Si_3N_4$, and low dielectric constant materials (such as SiOCH, SiOCFH) can he selected as the first insulating medium, and at least one of TaN, TiN, ZrN, and $MnSiO_3$ can be selected as the first copper diffusion barrier layer.

Figure 4:
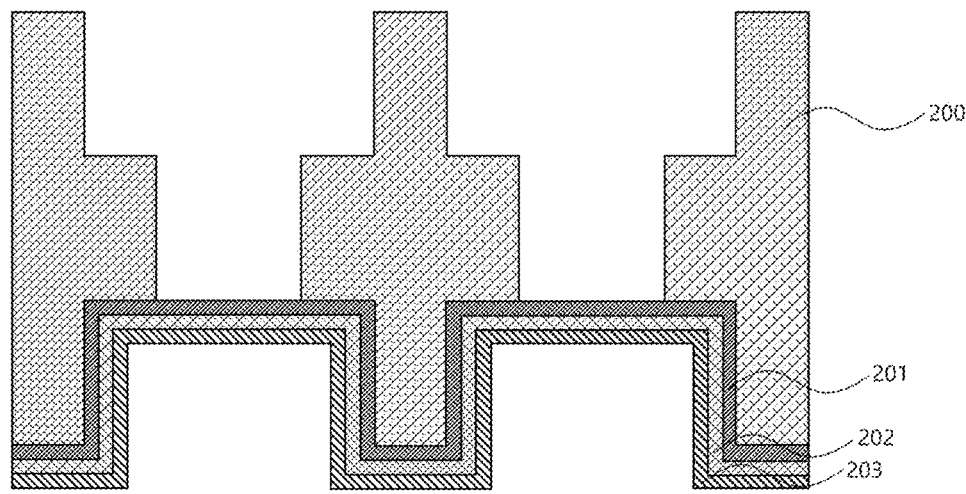

In step S3, a through silicon via is formed by etching between the top trench and the bottom trench. First, photoresist is spin-coated inside the top trench and the position of the through silicon via is defined through exposure and development processes. Then, a deep reactive ion etching (DRIE) process is used to etch the silicon substrate 200 between the top and bottom trenches until the first insulating medium 201 is contacted. Finally, the photoresist is dissolved in a solvent or is ached, and the resulting structure is shown in FIG. 4. The plasma for etching the silicon substrate 200 can he at least one of $CF_4$ and $SF_6$. In this embodiment, a deep reactive ion etching process is used to obtain the trench structure, but the present invention is not limited to this. At least one of dry etching such as ion beam etching, plasma etching, reactive ion etching, and deep reactive ion etching, laser ablation, or wet etching using an etchant solution, can be selected.

Figure 5:
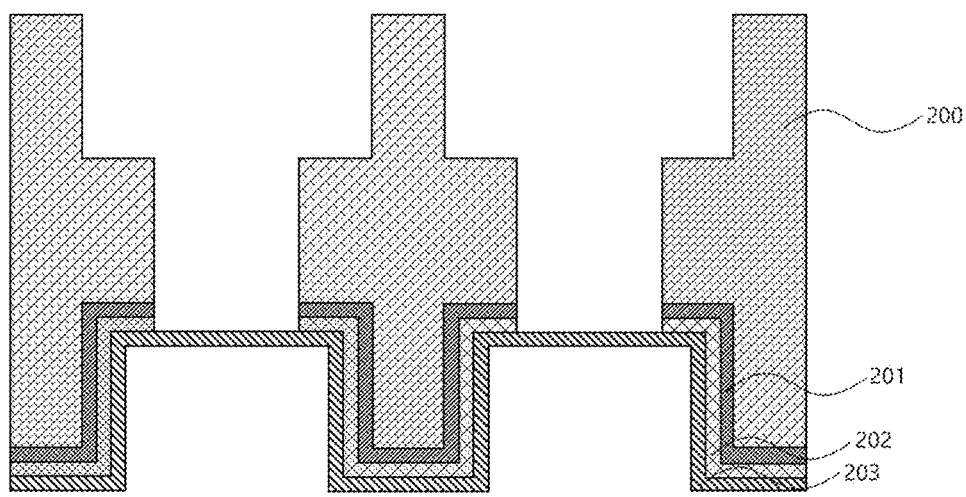
Figure 6:
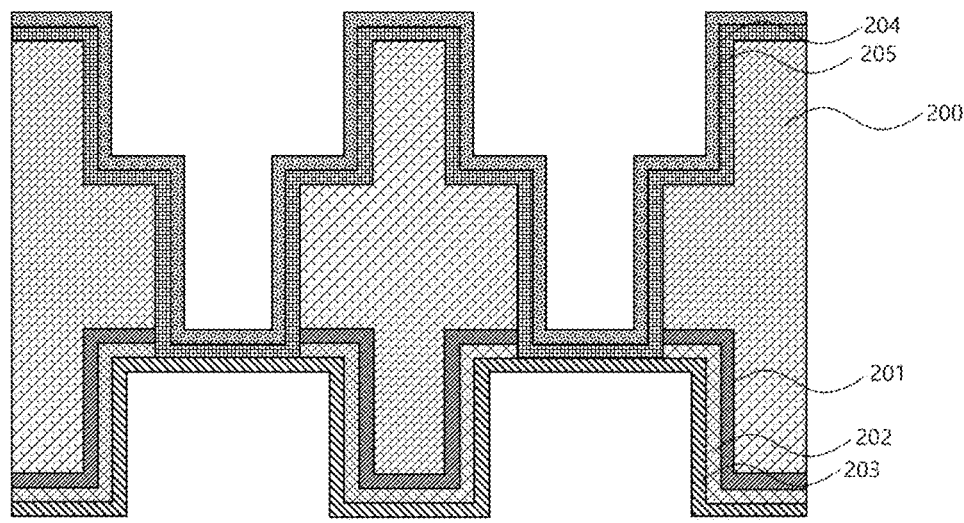
Figure 7:
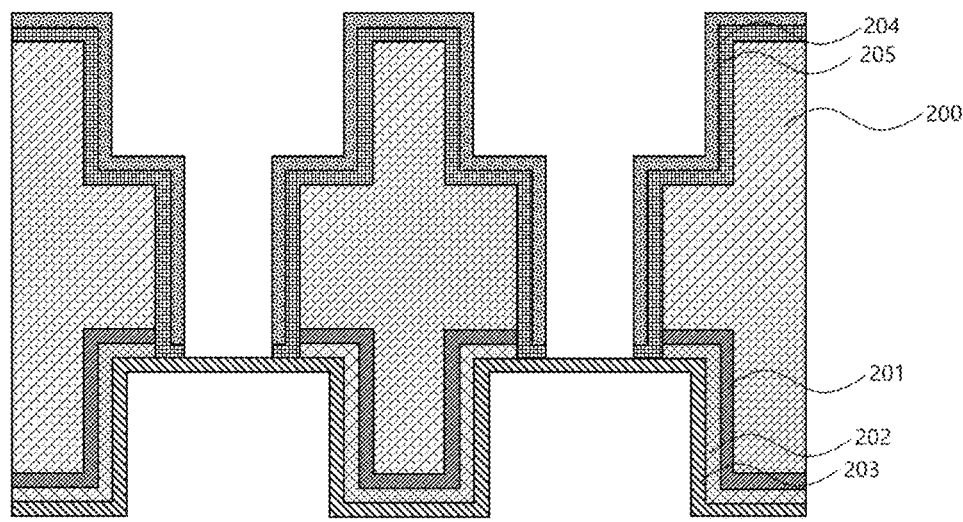

In step S4, a second insulating medium and a second copper diffusion barrier layer are deposited inside the top trench and the through silicon via. First, dry etching such as ion beam etching, plasma etching, reactive ion etching, laser ablation, or a wet etching process using an etchant solution, is used to remove the first insulating medium 201 and the first copper diffusion barrier layer 202 at the bottom of the through silicon via so as to expose the copper seed layer 203. The resulting structure is shown in FIG. 5. Then, a chemical vapor deposition process is used to sequentially deposit a $SiO_2$ film and a TaN film on the surfaces of the top trench and the through silicon via as the second insulating medium 204 and the second copper diffusion barrier layer 205, respectively. The resulting structure is shown in FIG. 6. Then, dry etching such as ion beam etching, plasma etching, reactive ion etching, laser ablation, or a wet etching process using an etchant solution, is used to remove the second insulating medium 204 and the second copper diffusion barrier layer 205 at the bottom of the through silicon via, thereby exposing the copper seed layer 203. The resulting structure is shown in FIG. 7. In this embodiment, the $SiO_2$ film is used as the second insulating medium, and the TaN film is used as the second copper diffusion barrier layer. However, the present invention is not limited to this. At least one of $SiO_2$, and low dielectric constant materials (such as SiOCH, SiOCFH) can be selected as the second insulating medium, and at least one of TaN, Ti N, ZrN, and MnSiO can be selected as the second copper diffusion barrier layer.

Figure 8:
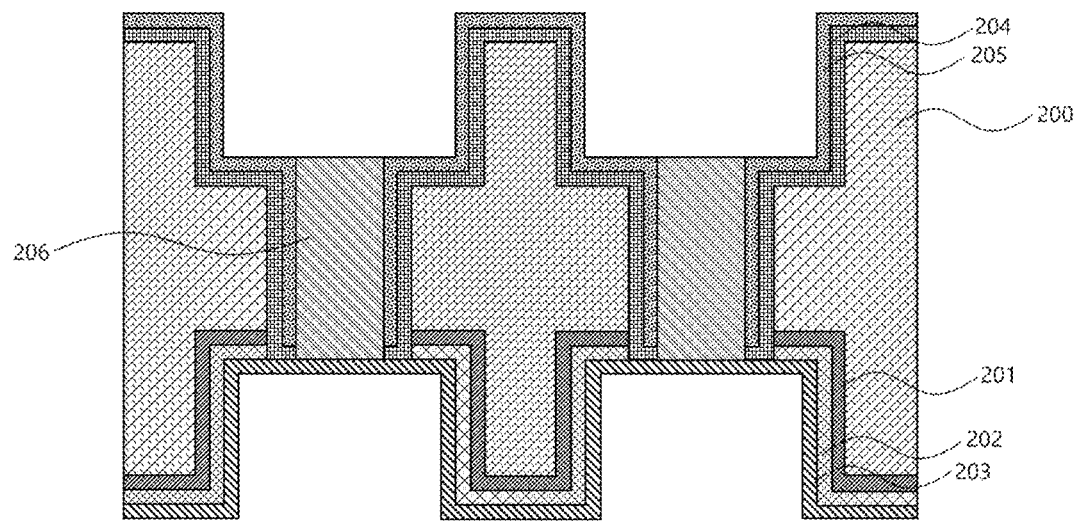
Figure 9:
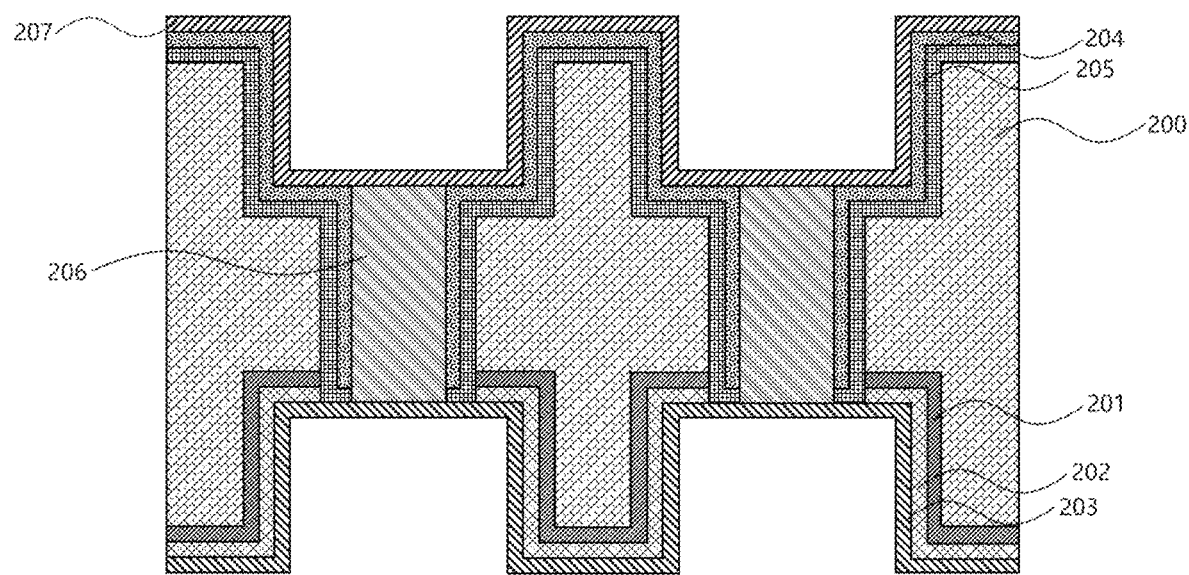

In step S5, a conductive copper pillar is electroplated inside the through silicon via, and a copper film is deposited inside the top trench. First, the copper seed layer 203 is used as the seed layer, and the copper material is electroplated on the surface thereof by an electroplating process. The copper material completely fills the through silicon via and is flush with the upper surface of the second copper diffusion barrier layer 205 at the bottom of the top trench so as to form a conductive copper pillar 206, and the resulting structure is shown in FIG. 8. Finally, a physical vapor deposition process is used to deposit a copper film 207 inside the top trench, and the resulting structure is shown in FIG. 9.

Figure 10:
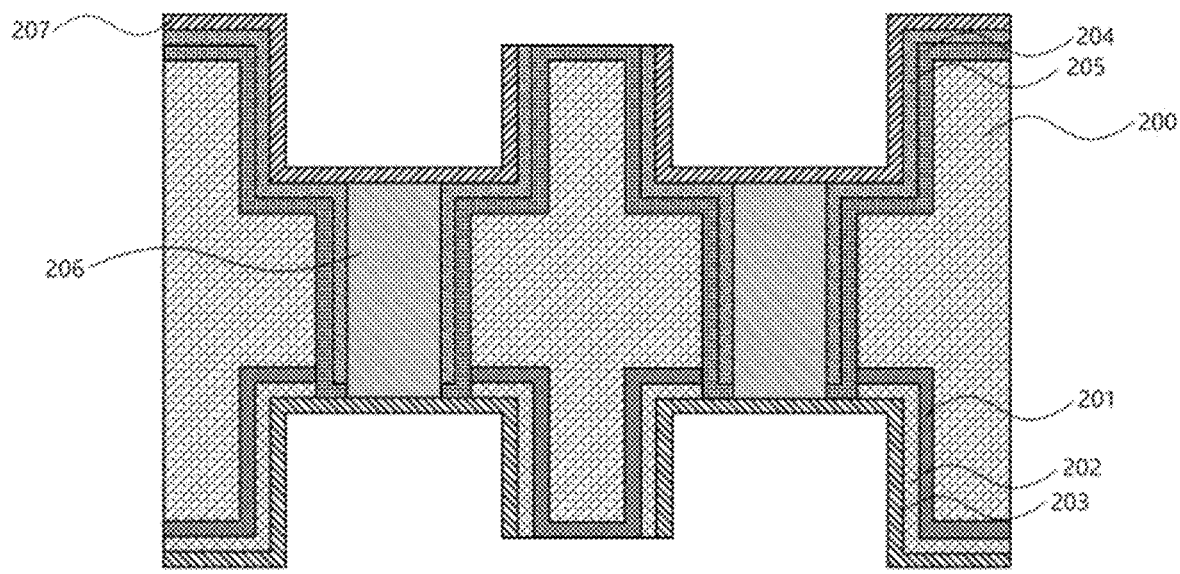
Figure 11:
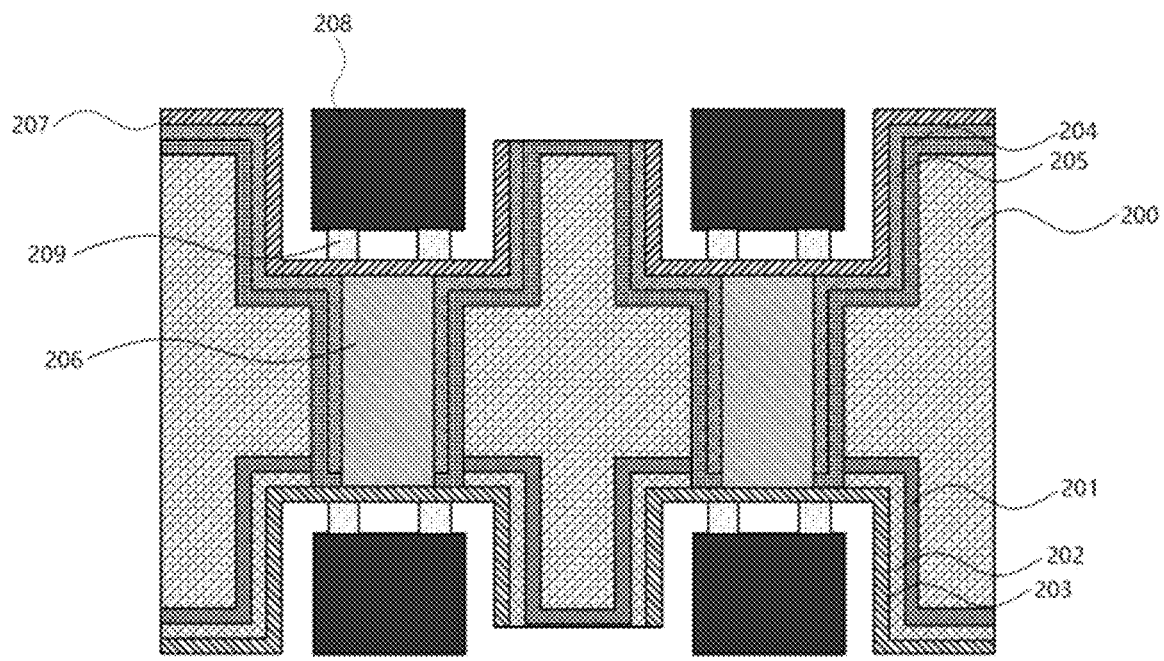
Figure 12:
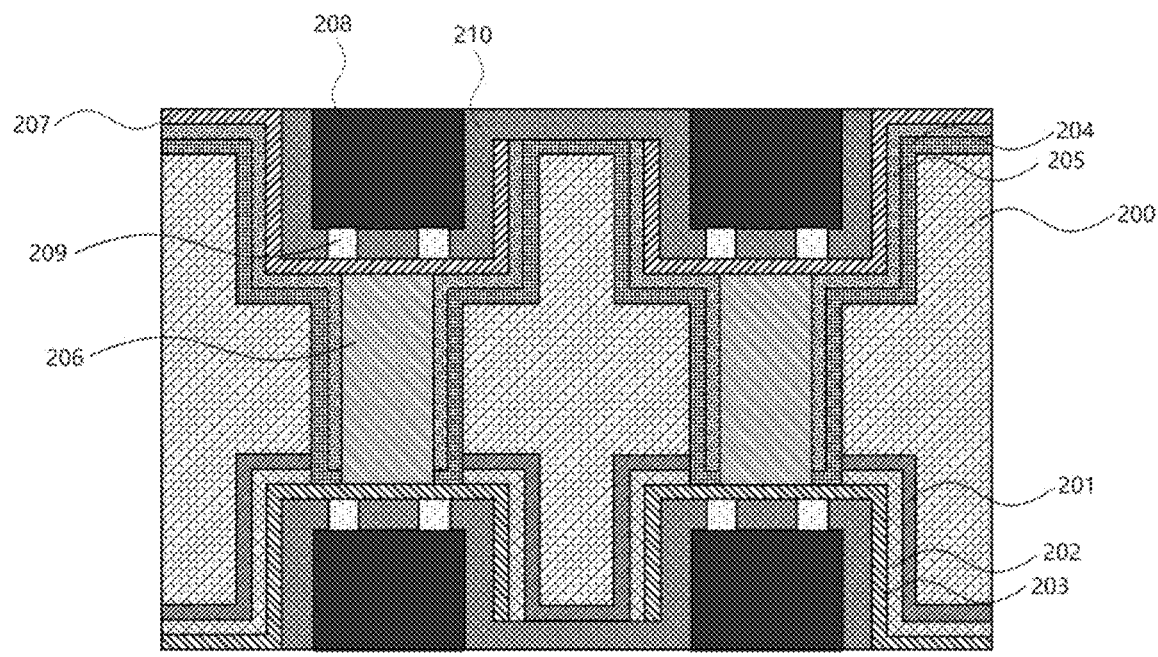

In step S6, a DRAM chip is embedded in the trench and bonded with the TSV structure and redistribution is done. First, photolithography and etching processes are used to remove the first copper diffusion barrier layer 202 and the copper seed layer 203 in a connection area between adjacent bottom trenches, and remove the second copper diffusion barrier layer 205 and the copper film 207 in a connection area between adjacent top trenches. The resulting structure is shown in FIG. 10. Further, the DRAM chip 208 with copper contact bumps 209 is placed inside the trench, and then copper-copper bonding is performed in the temperature range of 300 to 400° C., that is, the copper contact bumps 209 are respectively bonded to the copper film 207 and the copper seed layer 203 under heating conditions, and the resulting structure is shown in FIG. 11. Next, epoxy resin 210 is filled as a buffer layer and an isolation layer in the gaps between the DRAM chip 208 and the top trench and between the DRAM chip 208 and the bottom trench. The resulting structure is shown in FIG. 12. Finally, a redistribution layer 211 is formed on the top and bottom of the resulting structure, so that the DRAM chips in the horizontal direction are electrically connected, and the resulting structure is shown in FIG. 13.

Figure 13:
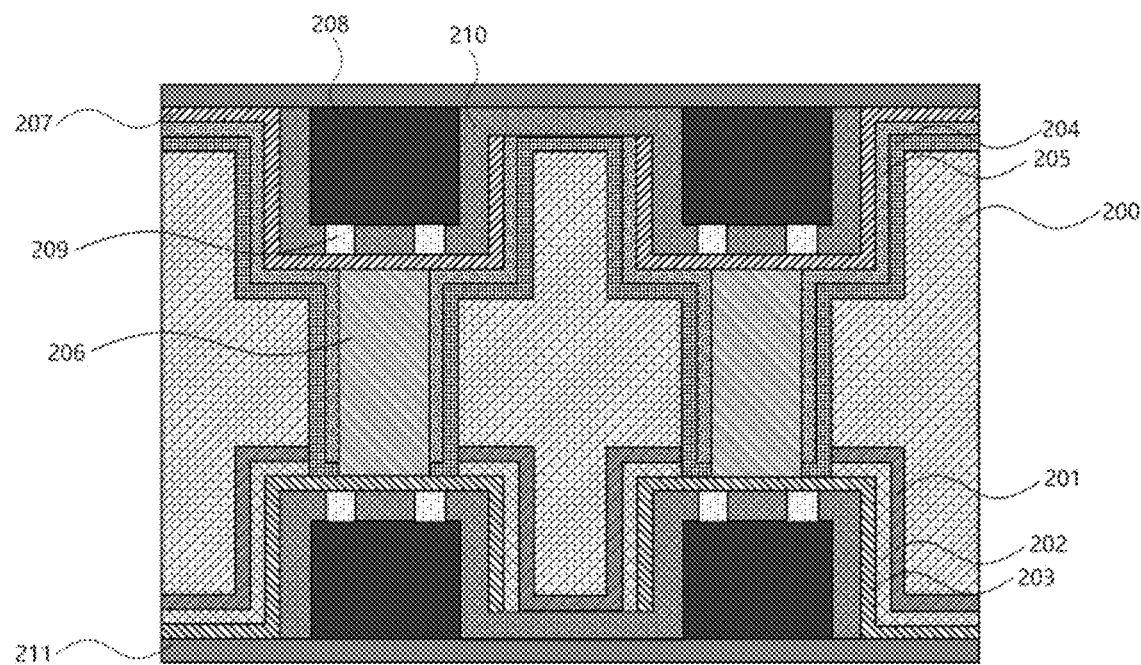

As shown in FIG. 13, a three-dimensional integrated system for DRAM chips of the present invention includes: a top trench, a bottom trench, and a through silicon via penetrating through the silicon substrate 200, wherein the through silicon via connects the top trench and the bottom trench;

the first insulating medium 201, the first copper diffusion hairier layer 202 and the copper seed layer 203, wherein the first insulating medium 201 covers the bottom trench and is discontinuous at the bottom of the TSV; the first copper diffusion barrier layer 202 covers the first insulating medium 201; the copper seed layer 203 covers the first copper diffusion barrier layer 202 and appears as a continuous film; the first copper diffusion barrier layer 202 and the copper seed layer 203 are disconnected at an adjacent area between the bottom trenches to achieve insulation;

the second insulating medium 204, the second copper diffusion barrier layer 205, the copper film 207, and the conductive copper pillar 206, wherein the second insulating medium 204 covers the top trench and the through silicon via, and appears as a discontinuous state on the top and bottom of the through silicon via; the second copper diffusion harrier layer 205 covers the second insulating medium 204; the copper film 207 covers the second copper diffusion barrier layer 205 within the top trench, and appears a continuous film; the conductive copper pillar 206 covers the second copper diffusion barrier layer 205 on the side-wall of the through silicon via and completely fills the through-silicon via, the top of the conductive copper pillar 206 is in contact with the copper film 207, and the bottom of the conductive copper pillar 206 is in contact with the copper seed layer 203; the second copper diffusion barrier layer 205 and the copper film 207 are discontinuous at an adjacent area between the top trenches to achieve insulation;

the DRAM chip 208, the contact bumps 209, the filler 210 and the redistribution layer 211, wherein the DRAM chip 208 is bonded to the copper seed layer 203 and the copper film 207 through contact bumps 209, respectively; the filler 210 fills the gaps between the DRAM chip 208 and the copper seed layer 203 as well as the copper film 207; the redistribution layer 211 covers the top and bottom of the three-dimensional integrated system.

Preferably, the first insulating medium and the second insulating medium are $SiO_2$, $Si_3N_4$, SiOCH, SiOCFH, or the like. The first copper diffusion barrier layer and the second copper diffusion barrier layer are at least one of TaN, TiN, ZrN, and $MnSiO_3$. The filler is epoxy resin.

The silicon wafer for fabricating an interposer of the present invention does not need to be thinned, so the process steps can be reduced, and the silicon material can be fully utilized, and the interposer will not have problems of warpage and deformation. In addition, by etching trenches on the interposer and placing the chips in the trenches, the overall package thickness will not be increased, and the chips can he protected from external impacts. In addition, the TSV structure between the upper and lower trenches opposite to each other can realize electrical connection of the DRAM chips in a vertical direction.

The above are only specific embodiments of the present invention, but the scope of protection of the present invention is not limited thereto. Any changes or substitutions easily occurred to those skilled in the art within the technical scope disclosed by the present invention should all be covered within the protection scope of the present invention.

What is claimed is:

1. A three-dimensional integrated system for DRAM chips, comprising:
   a top trench, a bottom trench and a through silicon via that penetrate through a silicon substrate (200), wherein the through silicon via connects the top trench and the bottom trench;
   a first insulating medium (201), a first copper diffusion barrier layer (202) and a copper seed layer (203), wherein the first insulating medium (201) covers the bottom trench and is discontinuous at the bottom of the through silicon via; the first copper diffusion barrier layer (202) is formed on the first insulating medium (201); the copper seed layer (203) covers the first copper diffusion barrier layer (202), and appears a continuous film; the first copper diffusion barrier layer (202) and the copper seed layer (203) are disconnected at a connection area between adjacent bottom trenches to achieve insulation;

a second insulating medium (204), a second copper diffusion barrier layer (205), a copper film (207) and a conductive copper pillar (206), wherein the second insulating medium (204) covers the top trench and the through silicon via, and is discontinuous at the bottom of the through silicon via; the second copper diffusion barrier layer (205) covers the second insulating medium (204); the copper film (207) covers the second copper diffusion barrier layer (205) within the top trench and appears a continuous film; the conductive copper pillar (206) covers the second copper diffusion barrier layer (205) on the sidewall of the through silicon via, and completely fills the through silicon via, the top of the conductive copper pillar (206) is in contact with the copper film (207), and the bottom of the conductive copper pillar (206) is in contact with the copper seed layer (203); the second copper diffusion barrier layer (205) and the copper film (207) is disconnected at a connection area of adjacent top trenches to achieve insulation;

a DRAM chip (208), contact bumps (209), a filler (210) and a redistribution layer (211), wherein the DRAM chip (208) is bonded to the copper seed layer (203) and the copper film (207) respectively through the contact bumps (209); the filler (210) fills the gaps between the DRAM chip (208) and the top trench as well as between the DRAM chip (208) and the bottom trench; the redistribution layer (211) covers the top and the bottom of the three-dimensional integrated system.

2. The three-dimensional integrated system for DRAM chips according to claim 1, wherein:

the first insulating medium (201) and the second insulating medium (204) are respectively at least one of $SiO_2$, $Si_3N_4$, SiOCH, and SiOCFH.

3. The three-dimensional integrated system for DRAM chips according to claim 1, wherein:

the first copper diffusion barrier layer (202) and the second copper diffusion barrier layer (205) are respectively at least one of TaN, TiN, ZrN, and $MnSiO_3$.

4. The three-dimensional integrated system for DRAM chips according to claim 1, wherein:

the filler (210) is epoxy resin.

* * * * *